(12) United States Patent
Kalnitsky et al.

(10) Patent No.: US 12,217,975 B2
(45) Date of Patent: Feb. 4, 2025

(54) SEMICONDUCTOR DEVICE HAVING METAL GATE AND POLY GATE

(71) Applicant: TAIWAN SEMICONDUCTOR MANUFACTURING CO., LTD., Hsinchu (TW)

(72) Inventors: Alexander Kalnitsky, San Francisco, CA (US); Wei-Cheng Wu, Hsinchu County (TW); Harry-Hak-Lay Chuang, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/527,151

(22) Filed: Dec. 1, 2023

(65) Prior Publication Data

US 2024/0096643 A1    Mar. 21, 2024

Related U.S. Application Data

(60) Continuation of application No. 17/850,643, filed on Jun. 27, 2022, now Pat. No. 11,854,828, which is a division of application No. 16/796,667, filed on Feb. 20, 2020, now Pat. No. 11,387,114.

(60) Provisional application No. 62/865,833, filed on Jun. 24, 2019.

(51) Int. Cl.
| | | |
|---|---|---|
| *H01L 29/78* | (2006.01) | |
| *H01L 21/321* | (2006.01) | |
| *H01L 21/8234* | (2006.01) | |
| *H01L 27/088* | (2006.01) | |
| *H01L 29/49* | (2006.01) | |
| *H01L 29/66* | (2006.01) | |

(52) U.S. Cl.
CPC .... *H01L 21/3212* (2013.01); *H01L 21/82345* (2013.01); *H01L 27/088* (2013.01); *H01L 29/4916* (2013.01); *H01L 29/66545* (2013.01); *H01L 29/66681* (2013.01); *H01L 29/6681* (2013.01); *H01L 29/7816* (2013.01)

(58) Field of Classification Search
CPC ....... H01L 29/66545; H01L 29/66681–66704; H01L 29/7816–7826; H01L 21/82345; H01L 21/823842
See application file for complete search history.

(56) References Cited

U.S. PATENT DOCUMENTS

| | | | |
|---|---|---|---|
| 6,333,223 B1 | 12/2001 | Moriwaki | |
| 6,872,627 B2 | 3/2005 | Chen | |
| 10,858,533 B2 | 12/2020 | Choi | |
| 2004/0026734 A1 | 2/2004 | Clevenger | |
| 2009/0108346 A1* | 4/2009 | Cai | H01L 29/66689 438/236 |
| 2009/0166676 A1* | 7/2009 | Lee | H01L 29/66628 257/192 |

(Continued)

*Primary Examiner* — Eric A. Ward
(74) *Attorney, Agent, or Firm* — Maschoff Brennan

(57) ABSTRACT

A semiconductor device includes a substrate, a first well, a second well, a metal gate, a poly gate, a source region, and a drain region. The first well and the second well are within the substrate. The metal gate is partially over the first well. The poly gate is over the second well. The poly gate is separated from the metal gate, and a width ratio of the poly gate to the metal gate is in a range from about 0.1 to about 0.2. The source region and the drain region are respectively within the first well and the second well.

20 Claims, 13 Drawing Sheets

(56) References Cited

U.S. PATENT DOCUMENTS

| | | | |
|---|---|---|---|
| 2009/0224333 A1 | 9/2009 | Lu | |
| 2011/0193161 A1* | 8/2011 | Zhu | H01L 29/7835 |
| | | | 438/283 |
| 2012/0161230 A1* | 6/2012 | Satoh | H01L 29/7816 |
| | | | 257/E29.264 |
| 2012/0228695 A1 | 9/2012 | Toh | |
| 2013/0292763 A1* | 11/2013 | Chang | H01L 29/7816 |
| | | | 257/335 |
| 2015/0325651 A1 | 11/2015 | Yao | |
| 2016/0190012 A1* | 6/2016 | Zhu | H01L 21/823475 |
| | | | 438/585 |
| 2017/0125297 A1 | 5/2017 | Wang | |
| 2017/0250277 A1 | 8/2017 | Wu | |

* cited by examiner

SEMICONDUCTOR DEVICE HAVING METAL GATE AND POLY GATE

PRIORITY CLAIM AND CROSS-REFERENCE

This application is a continuation application of U.S. patent application Ser. No. 17/850,643, filed on Jun. 27, 2022, which is divisional application of U.S. patent application Ser. No. 16/796,667, filed on Feb. 20, 2020, now U.S. Pat. No. 11,387,114, issued on Jul. 12, 2022, which claims priority to U.S. Provisional Application Ser. No. 62/865,833, filed Jun. 24, 2019, all of which are herein incorporated by reference in their entireties.

BACKGROUND

The semiconductor integrated circuit (IC) industry has experienced rapid growth. Technological advances in integrated circuit materials and design have produced generations of integrated circuits where each generation has smaller and more complex circuits than the previous generation. However, these advances have increased the complexity of processing and manufacturing integrated circuits and, for these advances to be realized, similar developments in integrated circuit processing and manufacturing are needed. In the course of integrated circuit evolution, functional density (i.e., the number of interconnected devices per chip area) has generally increased while geometry size (i.e., the smallest component that can be created using a fabrication process) has decreased.

The decreased geometry size leads to challenges in fabricating a type of transistor device known as a laterally diffused metal-oxide-semiconductor (LDMOS) transistor. The high blocking voltage ability of the LDMOS transistor can be achieved through a formation of a resistive path, which serves as a voltage drop in the channel region of the LDMOS transistor. Existing technologies use lightly doped source and drain regions to define the resistive path. As such, the resistive path is very shallow, particularly as the geometry sizes continue to shrink. The shallow resistive path may not offer resistance as high as desired for the LDMOS transistor. Further, the shrinking geometry sizes present challenges for accurate alignment and overlay control in fabricating the LDMOS transistor. Therefore, while existing methods of fabricating LDMOS transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
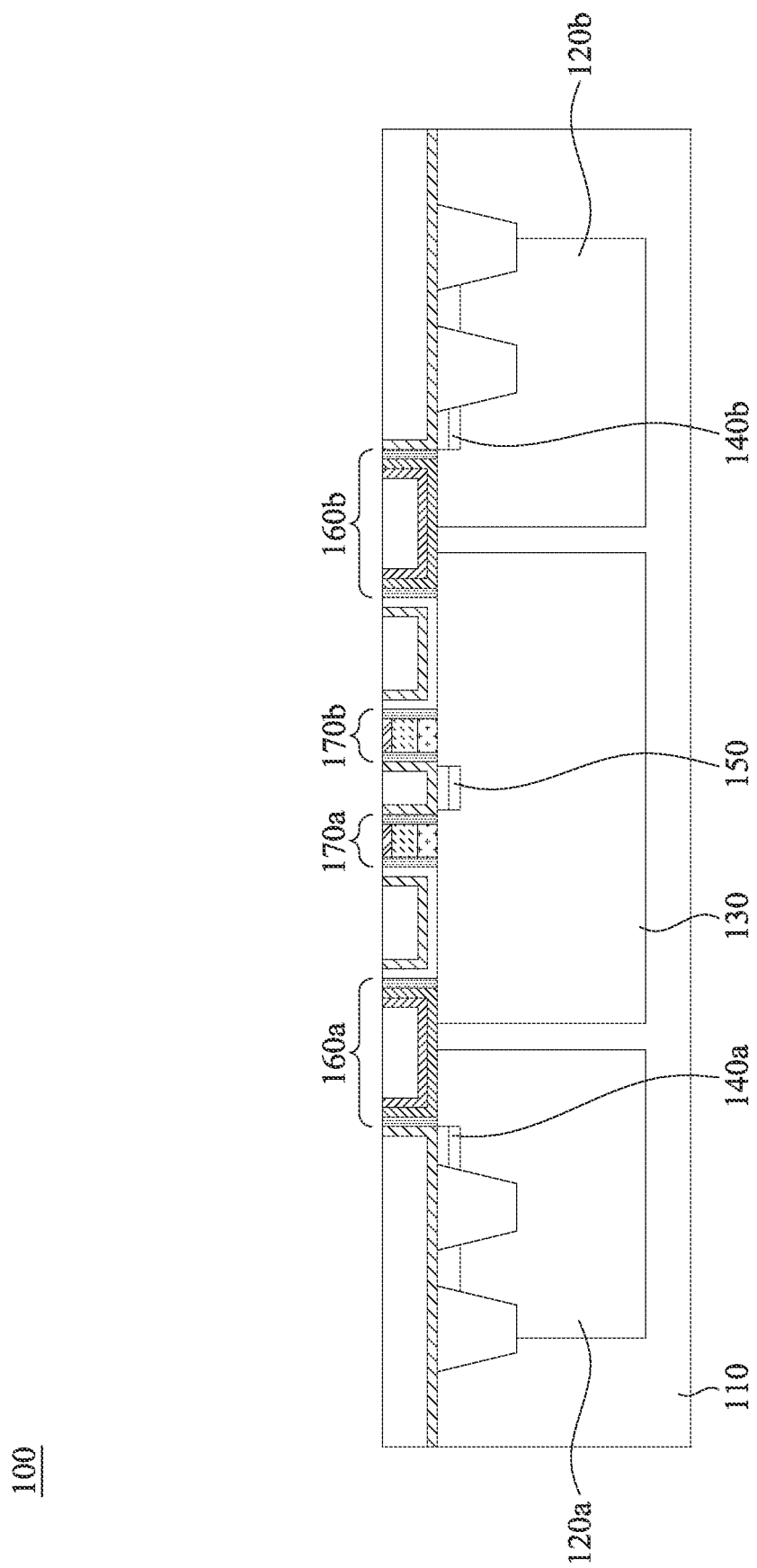
FIG. 1 is a cross-sectional view illustrating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100 in accordance with some embodiments of the present disclosure. The semiconductor device 100 includes a pair of laterally diffused metal-oxide-semiconductor (LDMOS) transistors, in which the two identical LDMOS transistors in the semiconductor device 100 are symmetrical with respect to a shared drain region 150, in a cross-sectional view shown in FIG. 1. In other words, the shared drain region 150 serves as a symmetrical centre of the semiconductor device 100 in a cross-sectional view shown in FIG. 1. The semiconductor device 100 includes a substrate 110, two first wells 120a and 120b, a second well 130, two source regions 140a and 140b, a drain region 150, two metal gates 160a and 160b, and two poly gates 170a and 170b. The first wells 120a and 120b and the second well 130 are within the substrate 110, in which the second well 130 is between the first wells 120a and 120b, and the first wells 120a and 120b and the second well 130 are separated by portions of the substrate 110. The source regions 140a and 140b are respectively within the first wells 120a and 120b, and the drain region 150 is within the second well 130 and between the two poly gates 170a and 170b to be shared by the two LDMOS transistors. The metal gate 160a is partially over the first well 120a and partially over the second well 130, and the metal gate 160b is partially over the first well 120b and partially over the second well 130. The poly gates 170a and 170b are over the second well 130, and are separated from each other. Additionally, the poly gates 170a and 170b are separated from the metal gates 160a and 160b.

Figure 2:
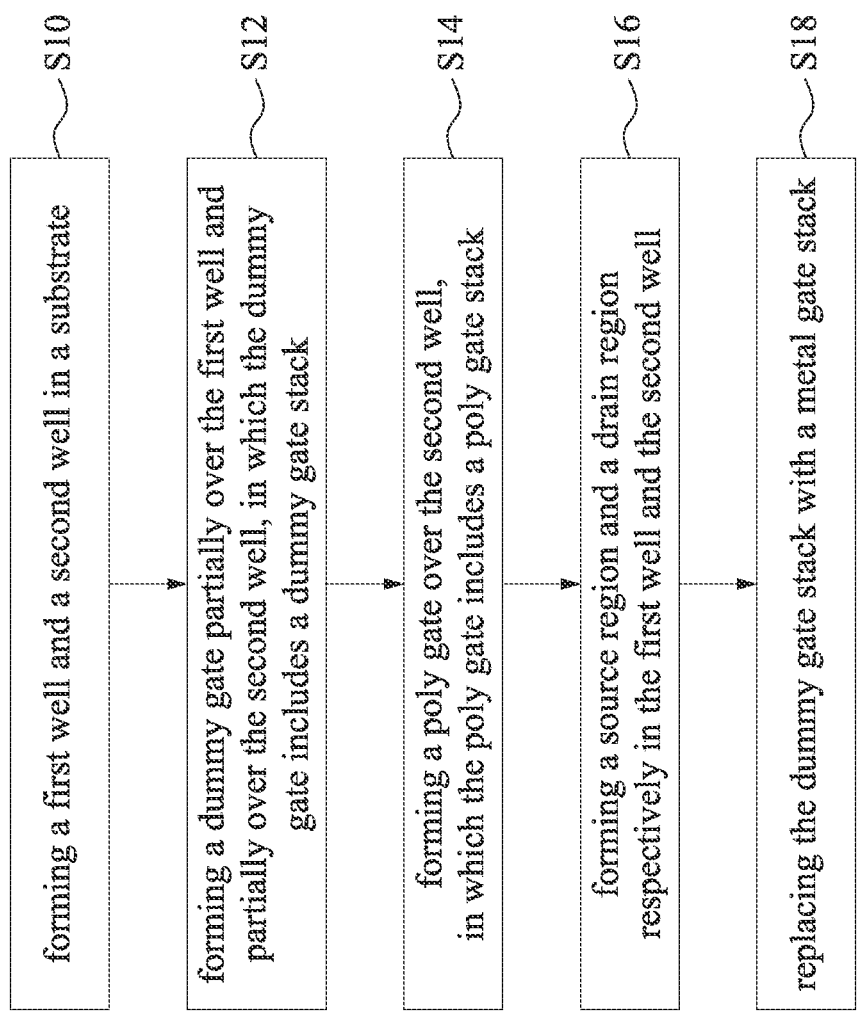
FIG. 2 is a flow chart illustrating a method of fabricating the semiconductor device shown in FIG. 1 in accordance with some embodiments of the present disclosure.

FIG. 2 is a flow chart illustrating a method of fabricating the semiconductor device 100 shown in FIG. 1 in accordance with some embodiments of the present disclosure. The method begins with block S10 in which a first well and a second well are formed in a substrate, wherein the first well and the second well are doped with different types of dopants. The method continues with block S12 in which a dummy gate is formed partially over the first well and partially over the second well, wherein the dummy gate includes a dummy gate stack. The method continues with block S14 in which a poly gate is formed over the second well, wherein the poly gate includes a poly gate stack, and a gap is between the dummy gate and the poly gate. The method continues with block S16 in which a source region and a drain region are respectively formed in the first well and the second well, wherein the source region and the drain region are doped with a same type of dopants. The method continues with block S18 in which the dummy gate stack is replaced with a metal gate stack.

FIGS. 3-12 are cross-sectional views illustrating a method for fabricating the semiconductor device 100 shown in FIG. 1 at various stages according to some embodiments. Accordingly, it should be noted that additional processes may be provided before, during, and after the method of FIG. 2, and that some other processes may only be briefly described herein.

Figure 3:
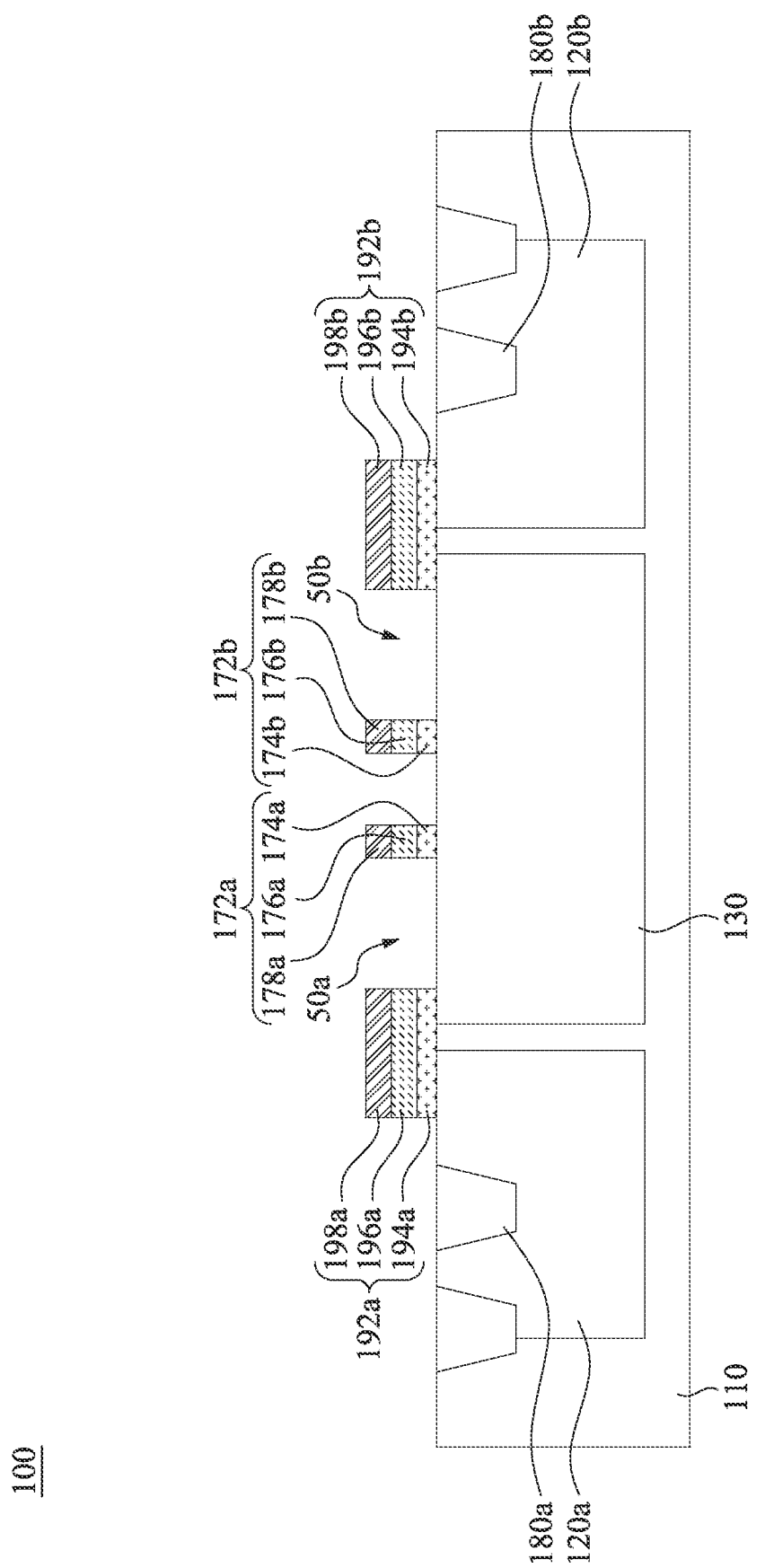
FIGS. 3-12 are cross-sectional views illustrating a method for fabricating the semiconductor device shown in FIG. 1 at various stages in accordance with some embodiments of the present disclosure.

In the present embodiment, the semiconductor device 100 includes n-type LDMOS transistors. It is understood that a p-type LDMOS semiconductor device may be formed in an alternative embodiment. Reference is made to FIG. 3. The semiconductor device 100 includes the substrate 110. In some embodiments, the substrate 110 is a silicon substrate doped with a p-type dopant such as boron. In other embodiments, the substrate 110 is a silicon substrate doped with an n-type dopant such as arsenic or phosphorous.

Isolation structures 180a and 180b are formed in the substrate 110. In some embodiments, each of the isolation structures 180a and 180b is a shallow trench isolation (STI) structure including a dielectric material, which may be silicon oxide or silicon nitride. The first wells 120a and 120b and the second well 130 are formed in the substrate 110. In some embodiments, each of the first wells 120a and 120b is a p-well doped with a p-type dopant such as boron, and the second well 130 is an n-well doped with an n-type dopant such as arsenic or phosphorous. In some embodiments, the first wells 120a and 120b and the second well 130 are separated by a portion of the substrate 110.

Dummy gate stacks 192a and 192b and poly gate stacks 172a and 172b are then formed over the substrate 110. The dummy gate stack 192a is partially formed over the first well 120a and the second well 130, and the dummy gate stack 192b is partially formed over the first well 120b and the second well 130. Furthermore, the poly gate stacks 172a and 172b are formed over the second well 130. Additionally, gaps 50a and 50b are respectively between the dummy gate stack 192a and the poly gate stack 172a and between the dummy gate stack 192b and the poly gate stack 172b. In some embodiments, the dummy gate stacks 192a and 192b and the poly gate stacks 172a and 172b are formed simultaneously in a same process and include a same material. For example, the dummy gate stacks 192a and 192b and the poly gate stacks 172a and 172b respectively include gate dielectric layers 194a and 194b and gate dielectric layers 174a and 174b. In some embodiments, a material of the gate dielectric layers 194a, 194b, 174a, and 174b includes silicon oxide. In another embodiment, the gate dielectric layers 194a, 194b, 174a, and 174b include a high-k dielectric material. The high-k dielectric material is a material having a dielectric constant that is greater than a dielectric constant of $SiO_2$ which is approximately 4. For example, the high-k dielectric material may include hafnium oxide ($HfO_2$), which has a dielectric constant in a range from about 18 to about 40. Alternatively, the high-k dielectric material may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The dummy gate stacks 192a and 192b and the poly gate stacks 172a and 172b further respectively include gate electrode layers 196a and 196b and gate electrode layers 176a and 176b that are respectively disposed over the gate dielectric layers 194a and 194b and the gate dielectric layers 174a and 174b. A material of the gate electrode layers 196a, 196b, 176a, and 176b includes polysilicon. The dummy gate stacks 192a and 192b and poly gate stacks 172a and 172b further respectively include hard mask layers 198a and 198b and hard mask layers 178a and 178b that are respectively disposed over the gate electrode layers 196a and 196b and the gate electrode layers 176a and 176b. The hard mask layers 198a, 198b, 178a, and 178b include a dielectric material, such as silicon oxide or silicon nitride. Although not illustrated herein, the hard mask layers 198a, 198b, 178a, and 178b were formed by patterning a hard mask material with a patterned photoresist layer. The hard mask layers 198a, 198b, 178a, and 178b were then used to pattern the gate electrode layers 196a, 196b, 176a, and 176b and the gate dielectric layers 194a, 194b, 174a, and 174b below so as to form the dummy gate stacks 192a and 192b and the poly gate stacks 172a and 172b.

Figure 4:
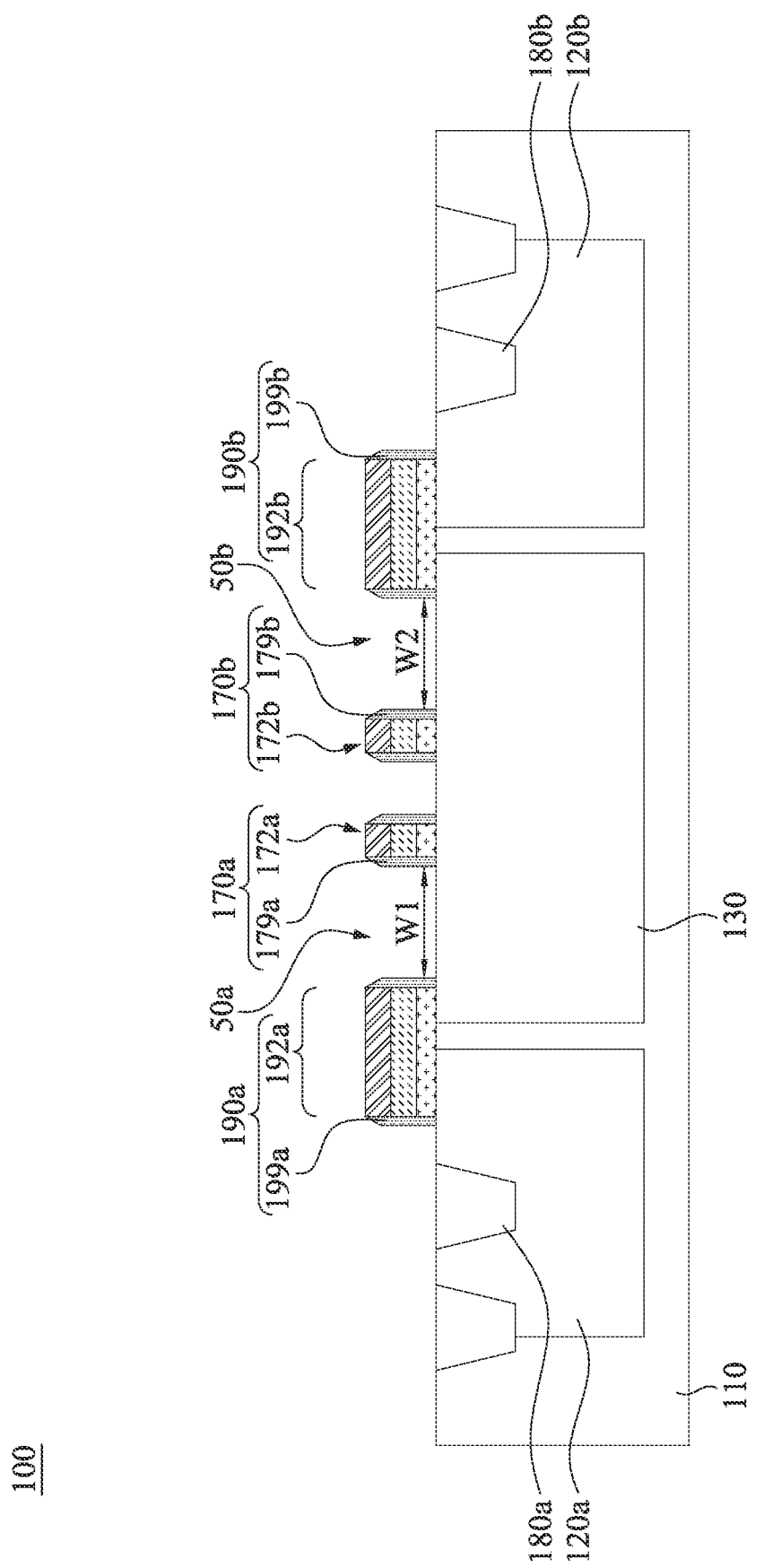

Reference is made to FIG. 4. First spacers 199a and 199b are respectively formed on sidewalls of the dummy gate stacks 192a and 192b, and second spacers 179a and 179b are respectively formed on sidewalls of the poly gate stacks 172a and 172b. As a result, the gaps 50a and 50b reappear with smaller widths W1 and W2, respectively. The first spacers 199a and 199b and the dummy gate stacks 179a and 179b are together referred to as the dummy gates 190a and 190b, and the second spacers 179a and 179b and the poly gate stacks 172a and 172b are together referred to as the poly gates 170a and 170b. In some embodiments, the first spacers 199a and 199b and the second spacers 179a and 199b are formed simultaneously in a same process and may include the same material. For example, the first spacers 199a and 199b and the second spacers 179a and 179b are formed using a deposition process and an etching process (for example, an anisotropic etching process). The first spacers 199a and 199b and the second spacers 179a and 179b may include a suitable dielectric material such as silicon nitride, silicon oxide, silicon carbide, silicon oxynitride, or combinations thereof.

Figure 5:
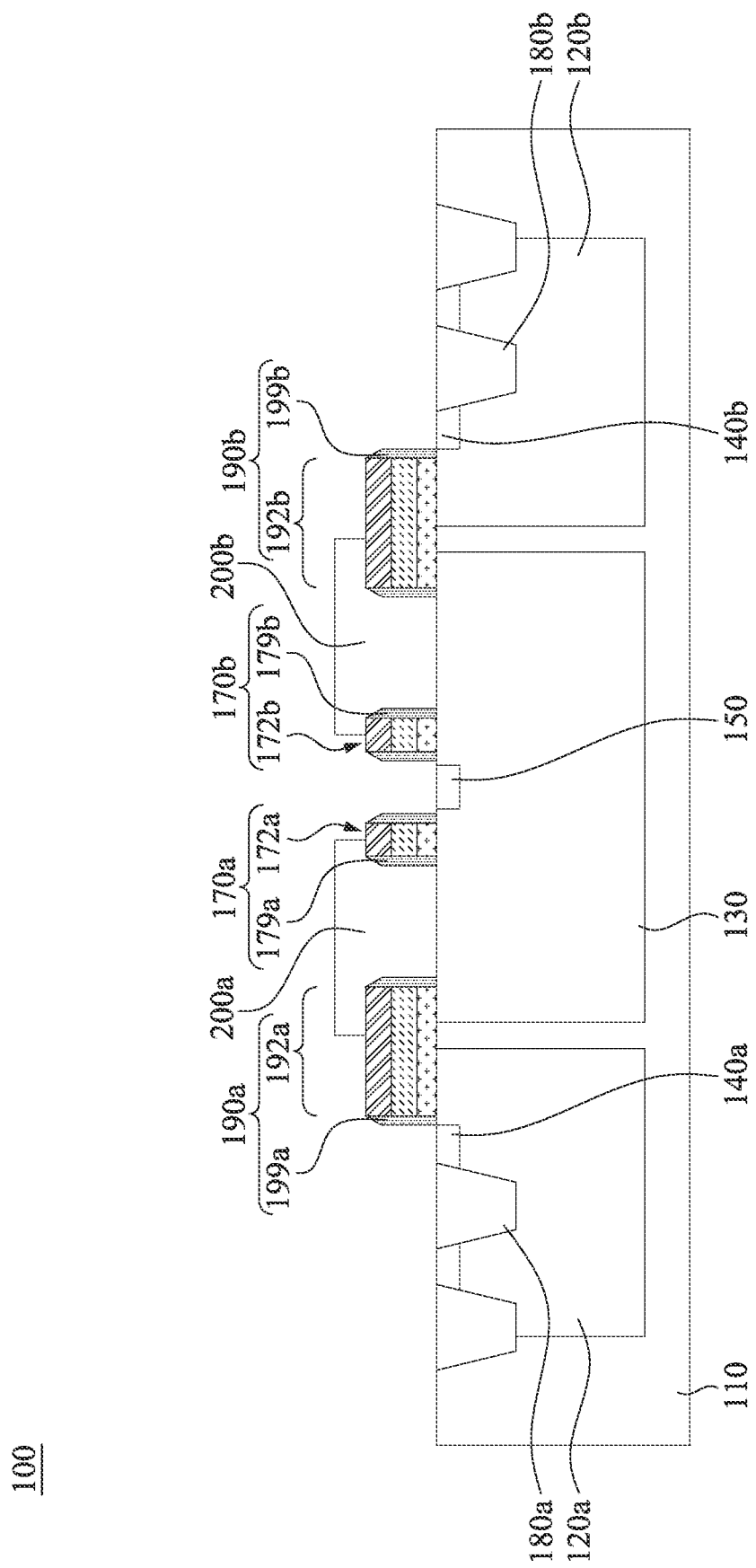

Reference is made to FIG. 5. Photoresist masks 200a and 200b are formed over the substrate 110. The photoresist masks 200a and 200b are formed by forming a photoresist layer over the substrate 110 and patterning the photoresist layer into the photoresist masks 200a and 200b in a lithography process. The photoresist mask 200a covers a portion of the dummy gate 190a and a portion of the poly gate 170a and fills the gap 50a (see FIG. 4), and the photoresist mask 200b covers a portion of the dummy gate 190b and a portion of the poly gate 170b and fills the gap 50b (see FIG. 4). The purpose of forming the photoresist masks 200a and 200b is to protect regions of the second well 130 underneath the gaps 50a and 50b (see FIG. 4) from being doped by dopants in a later implantation (or doping) process.

The source regions 140a and 140b are then respectively formed in the first wells 120a and 120b, and the drain region 150 is formed in the second well 130. The source regions 140a and 140b and the drain region 150 may be formed by an ion implantation process or a diffusion process. The source regions 140a and 140b and the drain region 150 may also be referred to as active regions. The source regions 140a and 140b and the drain region 150 are each doped with an n-type dopant such as arsenic or phosphorous. Since the dopants cannot penetrate through the dummy gate stacks 192a and 192b and the first spacers 199a and 199b around the dummy gate stacks 192a and 192b, the source region 140a is formed to be substantially self-aligned with one of the first spacers 199a of the dummy gate 190a, and the source region 140b is formed to be substantially self-aligned with one of the first spacers 199b of the dummy gate 190b. Similarly, since the dopants cannot penetrate through the poly gate stacks 172a and 172b and the second spacers 179a and 179b around the poly gate stacks 172a and 172b, the drain region 150 is formed to be substantially self-aligned with one of the second spacer 179a of the poly gate 170a and one of the second spacer 179b of the poly gate 170b. As discussed above, the photoresist masks 200a and 200b protects the regions of the second well 130 below the gaps 50a and 50b (see FIG. 4) from being implanted in this ion implantation process. After the implantation process, the dummy gate 190a and the drain region 150 are on opposite sides of the poly gate 170a, and the dummy gate 190b and the drain region 150 are on opposite sides of the poly gate 170b. In addition, the poly gate 170a and the source region 140a are on opposite sides of the dummy gate 190a, and the poly gate 170b and the source region 140b are on opposite sides of the dummy gate 190b.

Figure 6:
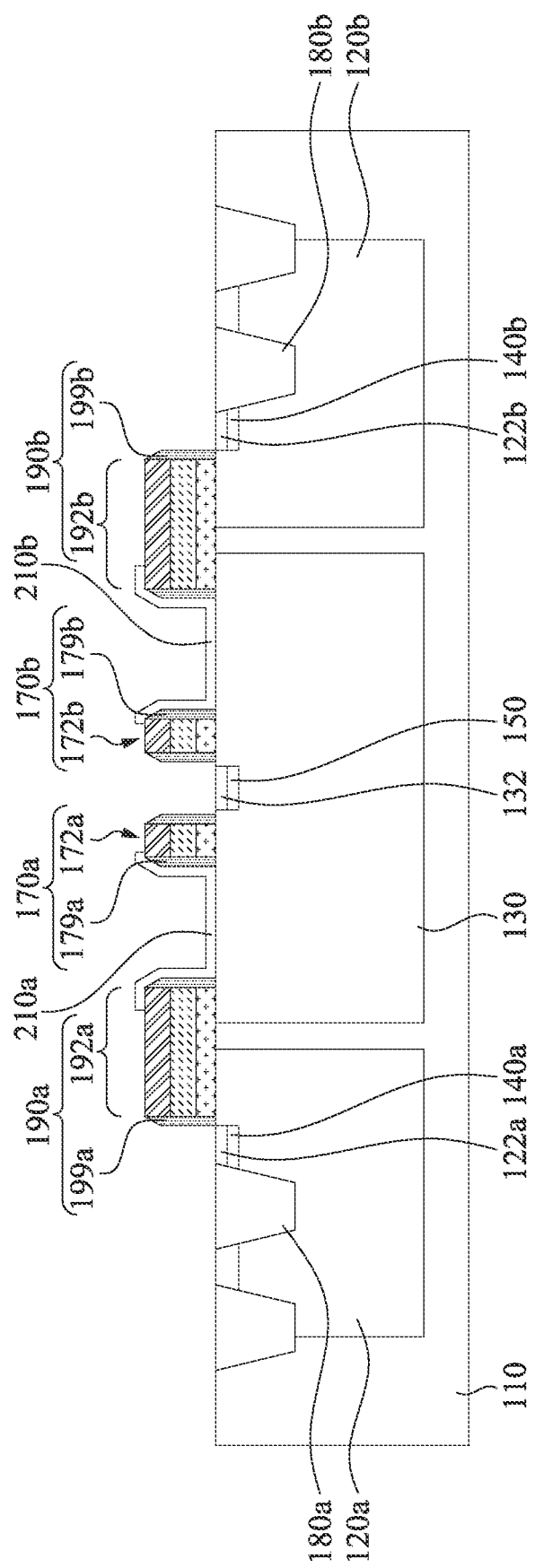

Reference is made to FIG. 6. The photoresist masks 200a and 200b (see FIG. 5) are then removed by a stripping or ashing process. Thereafter, a patterned resist protection oxide (RPO) layers 210a and 210b are respectively formed to partially fill the gaps 50a and 50b (see FIG. 4). The patterned RPO layers 210a and 210b are formed by conformally depositing a layer of oxide material over the substrate 110, the dummy gates 190a and 190b and the poly gates 170a and 170b, and patterning the layer of oxide material with a patterned photoresist (not illustrated) in a lithography process. After being patterned, the patterned RPO layer 210a is formed to cover a portion of the substrate 110 between the dummy gate 190a and the poly gate 170a, and extends to a sidewall of one of the first spacers 199a and a sidewall of one of the second spacers 179a between the dummy gate stack 192a and the poly gate stack 172a. Similarly, the patterned RPO layer 210b is formed to cover a portion of the substrate 110 between the dummy gate 190b and the poly gate 170b, and extends to a sidewall of one of the first spacers 199b and a sidewall of one of the second spacers 179b between the dummy gate stack 192b and the poly gate stack 172b. The patterned RPO layer 210a further covers a portion of the dummy gate stack 192a and a portion of the poly gate stack 172a, and the patterned RPO layer 210b further covers a portion of the dummy gate stack 192b and a portion of the poly gate stack 172b. A silicidation process is then performed on exposed surfaces of the substrate 110 to form substantially self-aligned silicides (also referred to as salicides) 122a and 132. That is, the patterned RPO layers 210a and 210b serve as silicidation masks in the silicidation process.

Figure 7:
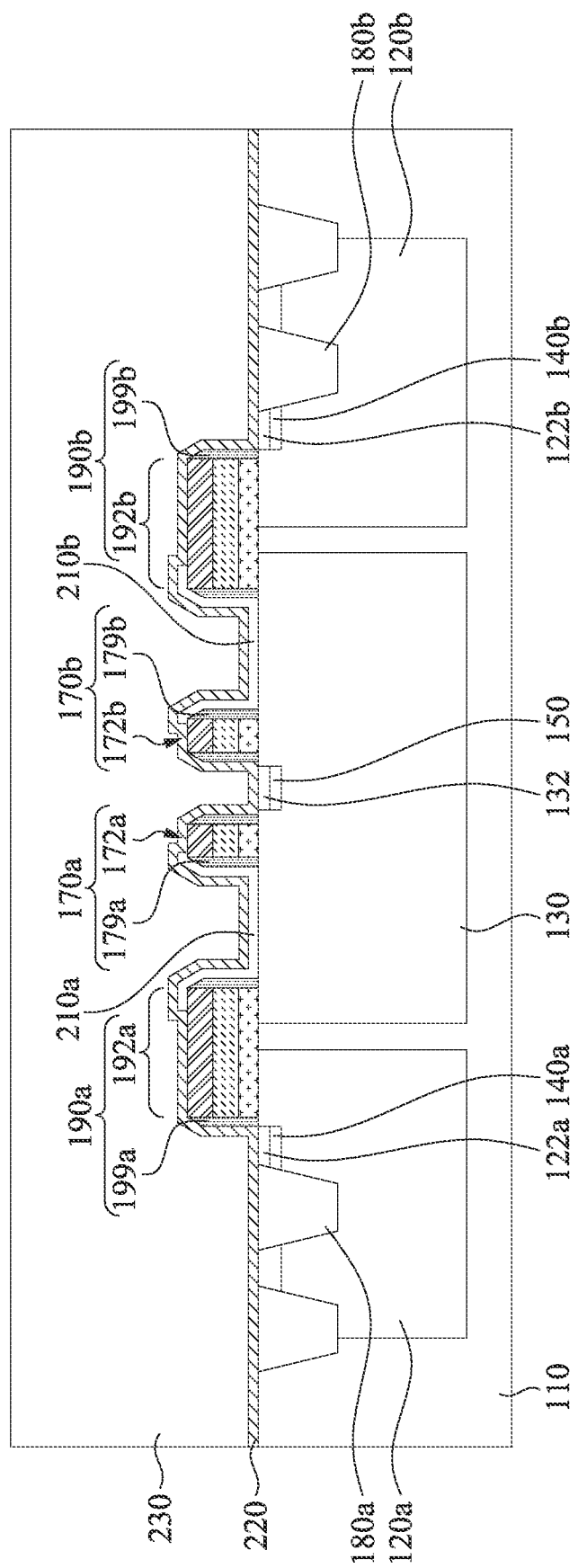

Referring is made to FIG. 7. An etch stop layer 220 is then conformally formed to cover the substrate 110, the dummy gates 190a and 190b, the poly gates 170a and 170b, and the patterned RPO layers 210a and 210b. In an alternative embodiment, the patterned RPO layers 210a and 210b are removed before the etch stop layer 220 is formed, such that the etch stop layer 220 is directly in contact with the first spacer 199a, the second spacer 179a, and the substrate 110 which are between the dummy gate stack 192a and the poly gate stack 172a. Similarly, in such an embodiment, the etch stop layer 220 is directly in contact with the first spacer 199b, the second spacer 179b, and the substrate 110 which are between the dummy gate stack 192b and the poly gate stack 172b. Thereafter, an interlayer dielectric (ILD) layer 230 is formed over the substrate 110 to cover the etch stop layer 220. The ILD layer 230 may be formed by chemical vapor deposition (CVD), high density plasma chemical vapor deposition (HDP CVD), spin-on, sputtering, or other suitable methods. In some embodiments, a material of the ILD layer 230 includes silicon oxide. In other embodiments, the ILD layer 230 may include silicon oxy-nitride, silicon nitride, or a low-k material.

Figure 8:
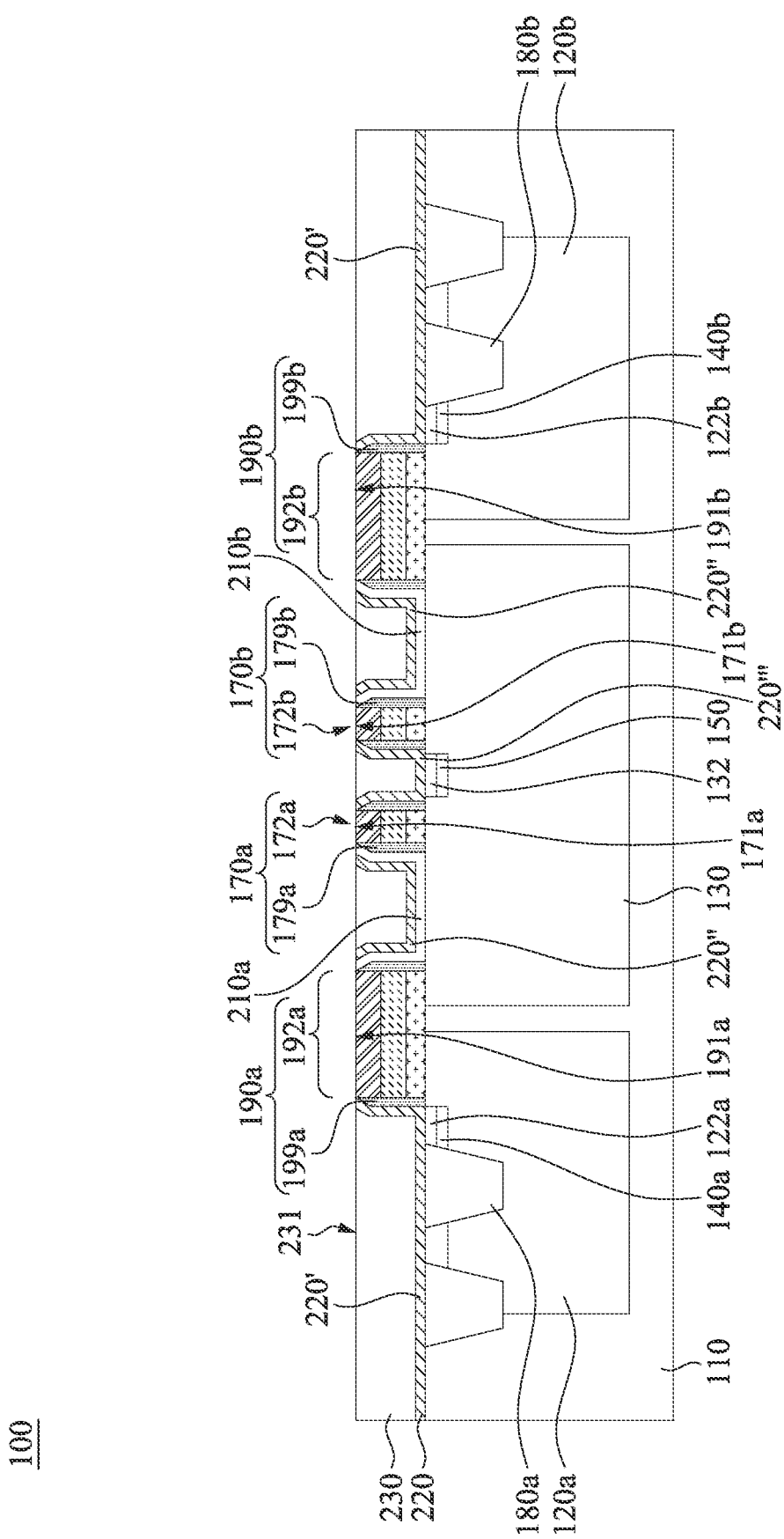

Reference is made to FIG. 8. A chemical-mechanical polishing (CMP) process is performed, such that the dummy gates 190a and 190b, the poly gates 170a and 170b, top portions of the patterned RPO layers 210a and 210b, and top portions of the etch stop layer 220 are exposed. Following by the CMP process, top surfaces 191a and 191b of the of the dummy gates 190a and 190b and top surfaces 171a and 171b of the poly gates 170a and 170b are substantially coplanar with a top surface 231 of the ILD layer 230 on either side of the dummy gates 190a and 190b and either side of the poly gates 170a and 170b. Furthermore, the etch stop layer 220 is divided into several portions after the CMP process. For example, the etch stop layer 220 is divided into three portions, in which a first portion 220' of the etch stop layer 220 directly covers the first wells 120a and 120b of the substrate 110 and a portion of the dummy gates 190a and 190b, a second portion 220" of the etch stop layer 220 is over the second well 130 of the substrate 110 and directly covers the patterned RPO layers 210a and 210b, and the third portion 220''' of the etch stop layer 220 directly covers the drain region 150 within second well 130 of the substrate 110 and portions of the poly gates 170a and 170b. Since the patterned RPO layers 210a and 210b has not been removed, the second portion 220" of the etch stop layer 220 is substantially higher than the first portion 220' and the third portion 220''' of the etch stop layer 220. Although not illustrated, one or more annealing processes are performed on the semiconductor device 100 to activate the source regions 140a and 140b and the drain regions 150 before or after the CMP process.

Figure 9:
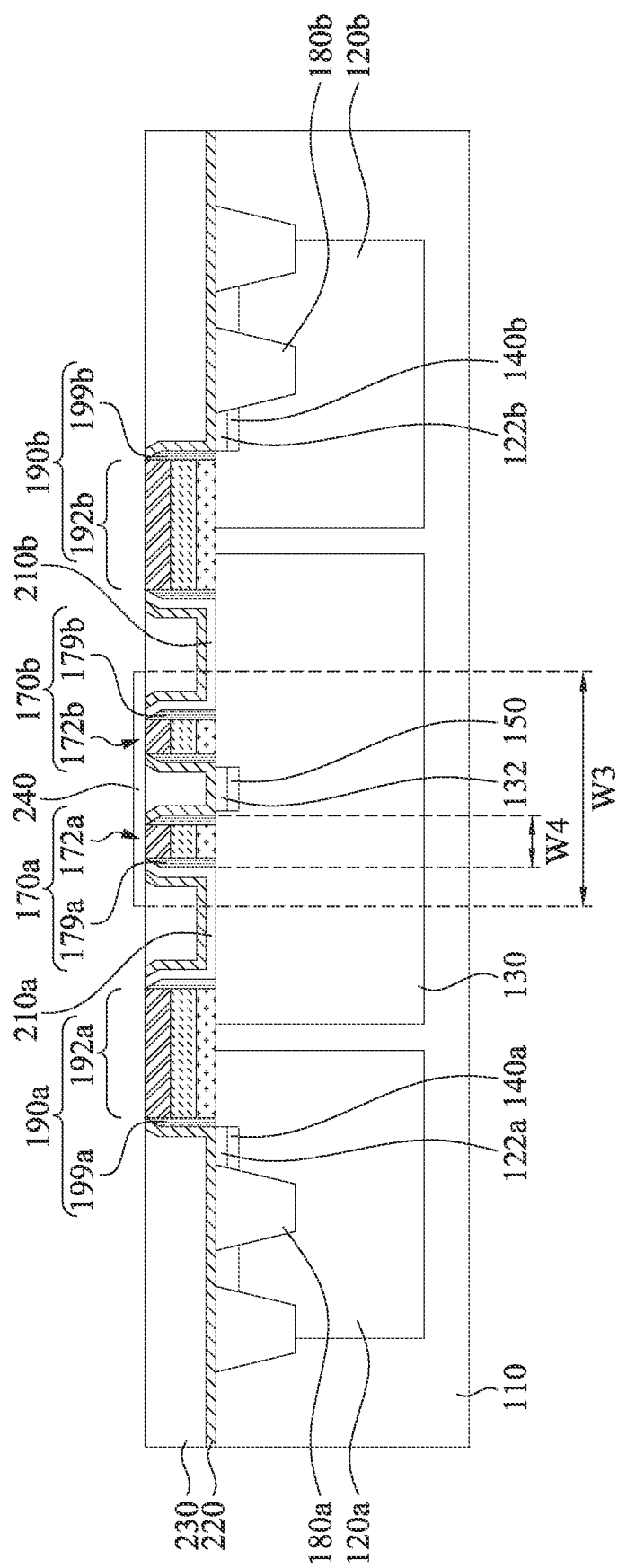

Reference is made to FIG. 9. A hard mask 240 is formed over the substrate 110 to cover the poly gates 170a and 170b. The purpose of forming the hard mask 240 is to protect the poly gate stacks 172a and 172b of the poly gates 170a and 170b from being removed in a later etching process. In some embodiments, a width W3 of the hard mask 240 is in a range from about 0.4 µm to 3.0 µm, which is larger than two times of a width W4 of each of the poly gates 170a and 170b that is in a range from about 0.02 µm to 0.2 µm. Such a width W3 of the hard mask 240 can ensure the poly gates 170a and 170b (or at least the poly gate stacks 172a and 172b of the poly gates 170a and 170b) being protected under the hard mask 240. For example, if the width W3 of the hard mask 240 is smaller than about 0.4 µm, the poly gates 170a and 170b may possibly be exposed to be under a risk of being removed in the later etching process. In some embodiments, the hard mask 240 is a photoresist mask which is formed by forming a photoresist layer over the substrate 110 and patterning the photoresist layer into the hard mask 240 in a lithography process. In some embodiments, a material of the hard mask 240 may include polymer. For example, the hard mask 240 may include a polymer material with t-butyloxycarbonyl (t-BOC) functional groups. In other embodiments, a material of the hard mask 240 may include metal.

Figure 10:
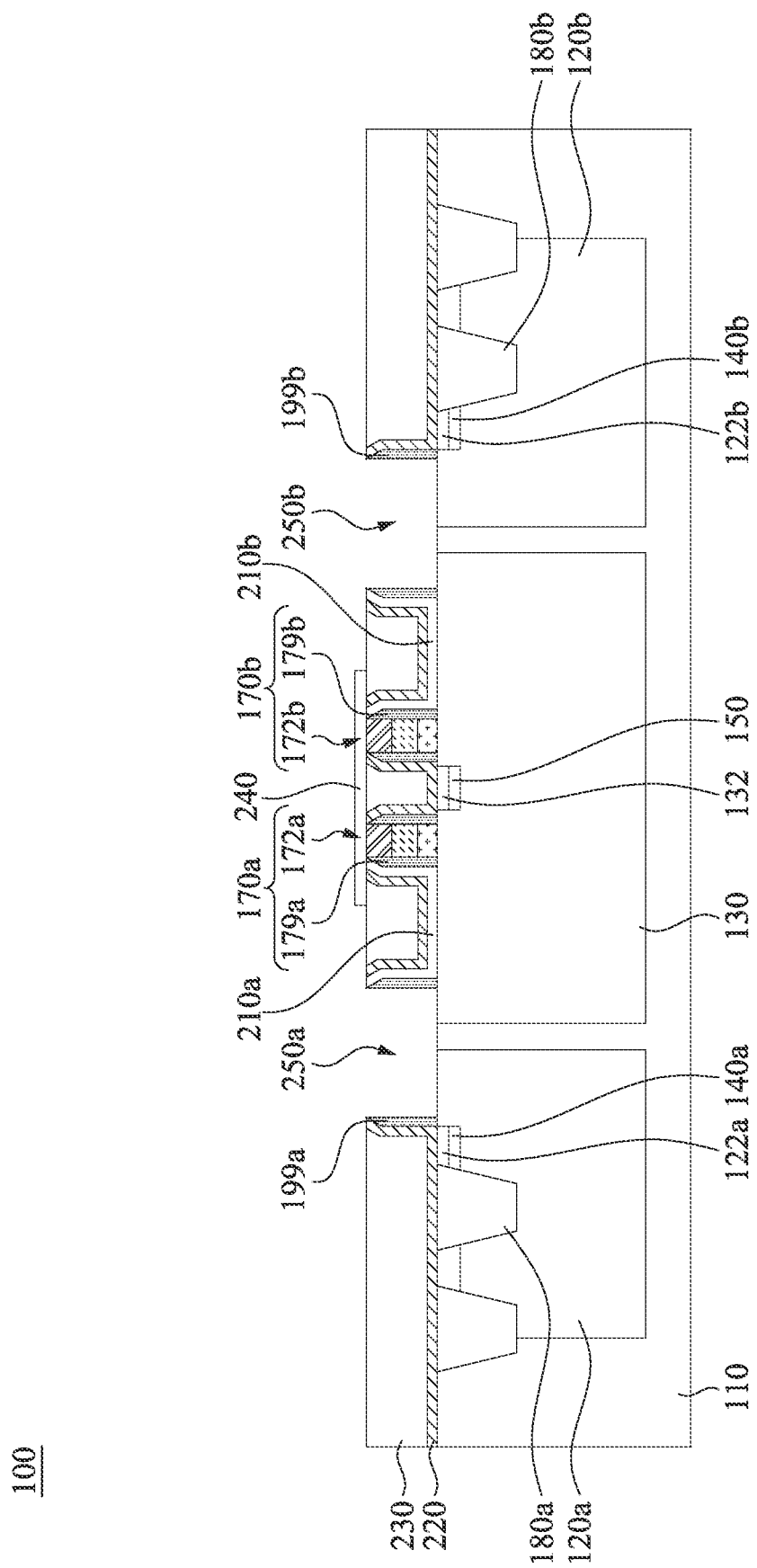

Reference is made to FIG. 10. The dummy gate stacks 192a and 192b (see FIG. 9) are then removed, thereby forming trenches 250a and 250b respectively in places of the dummy gate stacks 192a and 192b. The dummy gate stacks 192a and 192b may be removed in a wet etching or a dry etching process, while the rest of the layers of the semiconductor device 100 including the first spacers 199a and 199b, the ILD layer 230, the etch stop layer 220, and the patterned RPO layers 210a and 210b remain substantially unetched. Additionally, since the poly gates 170a and 170b are protected by the hard mask 240, the poly gates 170a and 170b including the poly gate stacks 172a and 172b and the second spacers 179a and 179b are also remained substantially unetched. In an alternative embodiment which the gate dielectric layers 194a and 194b (see FIG. 3) include a high-k dielectric material (instead of silicon oxide) as discussed above, the gate dielectric layers 194a and 194b are not removed. This alternative embodiment will be discussed in FIG. 13.

Figure 11:
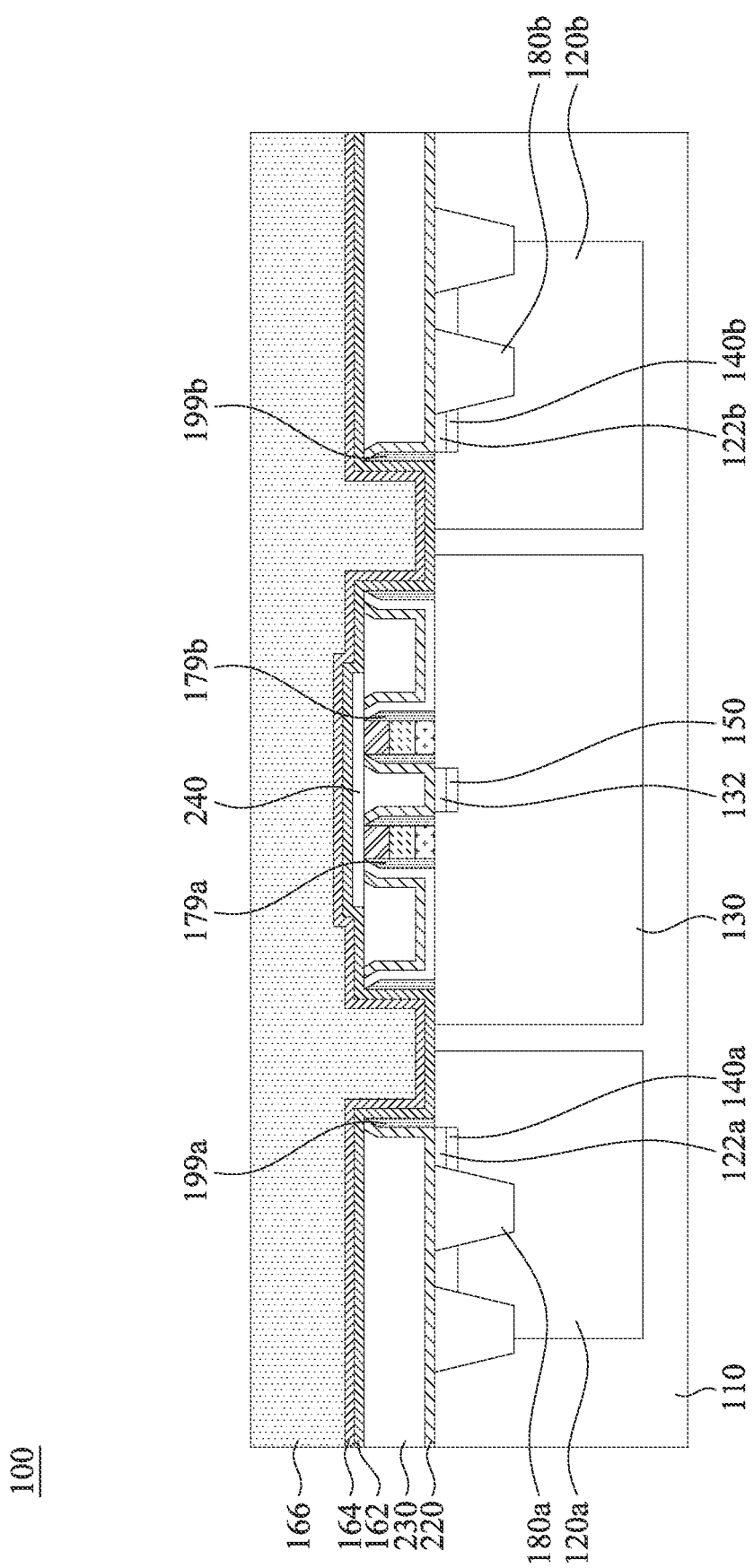

Reference is made to FIG. 11. A material of a high-k gate dielectric layer 162 is conformally formed in the trenches 250a and 250b (see FIG. 10) and covers the substrate 110, the ILD layer 230, the etch stop layer 220, the patterned RPO layers 210a and 210b, the first spacers 199a and 199b, and the hard mask 240. The material of a high-k gate dielectric layer 162 may be formed by CVD, physical vapor deposition (PVD), or other suitable techniques. The material of the high-k gate dielectric layer may include the high-k dielectric material as discussed above. Although not illustrated, it is understood that a material of an interfacial layer may be formed before the material of the high-k gate dielectric layer 162 is formed. Thereafter, a material of a first conductive layer 164 is formed over the material of the high-k gate dielectric layer 162. The material of the high-k gate dielectric layer 162 may include an n-type work function metal (n-metal), which may be titanium (Ti), aluminum (Al), tantalum (Ta), ZrSi$_2$, TaN, or combinations thereof. Each of the n-metals has a respective range of work functions values associated therein. The material of the first conductive layer 164 may be formed by CVD, PVD, or other suitable techniques. After that, a material of a second conductive layer 166 is formed over the material of the first conductive layer 164. The material of the second conductive layer 166 may include one of tungsten (W), Aluminum (Al), copper (Cu), and combinations thereof. The second conductive layer 166 may be formed by CVD, PVD, plating, or other suitable techniques.

Figure 12:
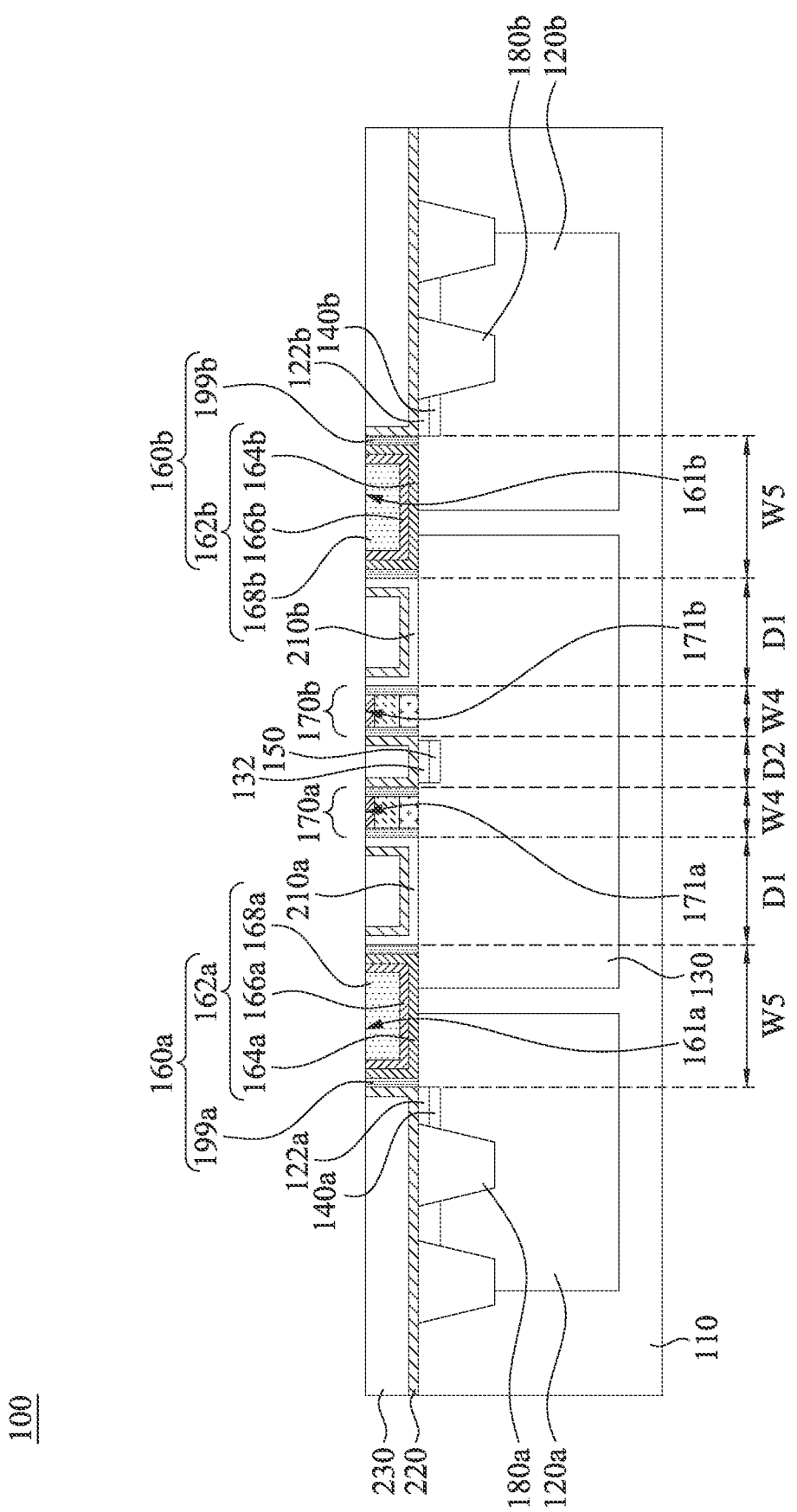

Reference is made to FIG. 12. A CMP process is performed, such that the ILD layer 230, the etch stop layer 220, the patterned RPO layers 210a and 210b, and the poly gates 170a and 170b are exposed. In the embodiment which the material of the hard mask 240 includes metal, the hard mask 240 is removed along with top portions of the material of the high-k gate dielectric layer 162 (see FIG. 11), the material of the first conductive layer 164 (see FIG. 11), and the material of the second conductive layer 166 (see FIG. 11) during the CMP process. In the alternative embodiment which the material of the hard mask 240 includes polymer, the CMP process is first performed to remove top portions of the material of the high-k gate dielectric layer 162 (see FIG. 11), the material of the first conductive layer 164 (see FIG. 11), and the material of the second conductive layer 166 (see FIG. 11) to expose the hard mask 240 (see FIG. 11). Thereafter, the hard mask 240 is removed by a stripping or ashing process. After that, the CMP process is continuously performed to remove the remaining layers, such that the ILD layer 230, the etch stop layer 220, the patterned RPO layers 210a and 210b, and the poly gates 170a and 170b are exposed. As a result, the metal gate stack 162a including the high-k gate dielectric layer 164a, the first conductive layer 166a, and the second conductive layer 168a is formed in the trench 250a (see FIG. 10) and between the first spacers 199a, and the metal gate stack 162b including the high-k gate dielectric layer 164b, the first conductive layer 166b, and the second conductive layer 168b is formed in the trench 250b (see FIG. 10) and between the first spacers 199b. The metal gate stack 162a and the first spacers 199a are together referred to as the metal gate 160a, and the metal gate stack 162b and the first spacers 199b are together referred to as the metal gate 160b. In addition, top surfaces 161a and 161b of the metal gates 160a and 160b are substantially coplanar with the top surfaces 171a and 171b of the poly gates 170a and 170b. In other words, top surfaces 161a and 161b of the second conductive layers 168a and 168b of the metal gates 160a and 160b are coplanar with top surfaces 171a and 171b of the hard mask layers 178a and 178b of the poly gates 170a and 170b.

In some embodiments, the first conductive layers 166a and the second conductive layer 168a together constitute the gate electrode portion of the metal gate stack 162a, and the first conductive layers 166b and the second conductive layer 168b together constitute the gate electrode portion of the metal gate stack 162b. The first conductive layers 166a and 166b tune a work function of the semiconductor device 100 such that a desired threshold voltage is achieved. Thus, the first conductive layers 166a and 166b may also be referred to as work function metal layers. Additionally, the second conductive layers 168a and 168b respectively serve as the main conductive portions of the metal gate stacks 162a and 162b and may be referred to as fill metal layers.

Since the semiconductor device 100 includes the metal gates 160a and 160b and the poly gates 170a and 170b, and the materials of the metal gates 160a and 160b is different from the materials of the poly gates 170a and 170b, gate height loss in a centre of an array aligned by the semiconductor devices 100 caused by dishing or erosion effect during the CMP process can be reduced. For example, more than one semiconductor devices may be aligned to form an array, and due to the mechanical restrictions of the CMP process, the centre of the array is more likely to suffer stronger grinding force than the peripheral of the array. As such, gate height loss in the centre of the array may be obvious. However, the CMP process may slow down when being performed on the poly gates 170a and 170b of the semiconductor device 100 in the present disclosure since the materials of the poly gates 170a and 170b have a larger density relative to the materials of the metal gates 160a and 160b. Therefore, the dishing or erosion phenomenon can be reduced, thus improving the uniformity of the array and achieving a larger process window for the subsequent fabricating processes. Additionally, there's no need for enlarging the size of the array to reduce the distribution density of the metal gates 160a and 160b for the concern of the gate height loss. Therefore, numbers of the semiconductor device 100 in the array can be reduced, thus lowering the associated costs.

After the metal gate stacks 160a and 160b are formed, the semiconductor device 100 is formed. As mentioned above, the semiconductor device 100 may include a pair of LDMOS transistors, in which the two identical LDMOS transistors in the semiconductor device 100 are symmetrical with respect to a shared drain region 130, in a cross-sectional view shown in FIG. 12. In such an embodiment, the semiconductor device 100 includes a substrate 110, two first wells 120a and 120b, a second well 130, two source regions 140a and 140b, a drain region 150, two metal gates 160a and 160b, and two poly gates 170a and 170b. The first wells 120a and 120b and the second well 130 are within the substrate 110, in which the second well 130 is between the first wells 120a and 120b, and the first wells 120a and 120b and the second well 130 are separated by portions of the substrate 110. The source regions 140a and 140b are respectively within the first wells 120a and 120b, and the drain region 150 is within the second well 130 and between the two poly gates 170a and 170b to be shared by the two LDMOS transistors. The metal gate 160a is partially over the first well 120a and partially over the second well 130, and the metal gate 160b is partially over the first well 120b and partially over the second well 130. The poly gates 170a and 170b are over the second well 130. The metal gates 160a and 160b and the drain region 130 are on opposite sides of the poly gates 170a and 170b, and the poly gates 170a and 170b and the source regions 120a and 120b are on opposite sides of the metal gates 160a and 160b.

In some embodiments, the width W4 of each of the poly gates 170a and 170b is in a range from about 0.02 μm to about 0.2 μm, and a width W5 of each of the metal gates 160a and 160b is in a range from about 0.1 μm to about 2 μm. Stated differently, a width ratio of the poly gates 170a and 170b to the metal gates 160a and 160b is in a range from about 0.1 to about 0.2 μm. Such a width ratio implies a suitable area ratio of the poly gates 170a and 170b to the metal gates 160a and 160b, thus providing a suitable density for the array aligned by the semiconductor device 100. As such, the CMP process can be moderately performed on the array. If the width ratio of the poly gates 170a and 170b to the metal gates 160a and 160b is too small, the gate height loss in the centre of the array may be obvious due to the small density; if the width ratio of the poly gates 170a and 170b to the metal gates 160a and 160b is too large, the density of the semiconductor device 100 may be too large, and thus making it difficult for the CMP process to be performed.

In some embodiments, a distance D1 between the metal gates 160a and 160b and the poly gates 170a and 170b is in a range from about 0.1 μm to about 1 μm, and a distance D2 between the poly gates 170a and 170b is in a range from about 0.1 μm to about 1 μm. Such distances D1 and D2 provide a suitable distribution density for the poly gates 170a and 170b. More specifically, if the distance D1 between the metal gates 160a and 160b and the poly gates 170a and 170b and the distance D2 between the poly gates 170a and 170b are respectively smaller than 0.1 μm, the distribution density of the poly gates 170a and 170b may be too large, thus making it difficult for the CMP process to be performed; if the distance D1 between the metal gates 160a and 160b and the poly gates 170a and 170b and the distance D2 between the poly gates 170a and 170b are larger than 1 μm, the distribution density of the poly gates 170a and 170b may be too small, such that the gate height loss in the centre of the array aligned by the semiconductor device 100 may be obvious.

Figure 13:
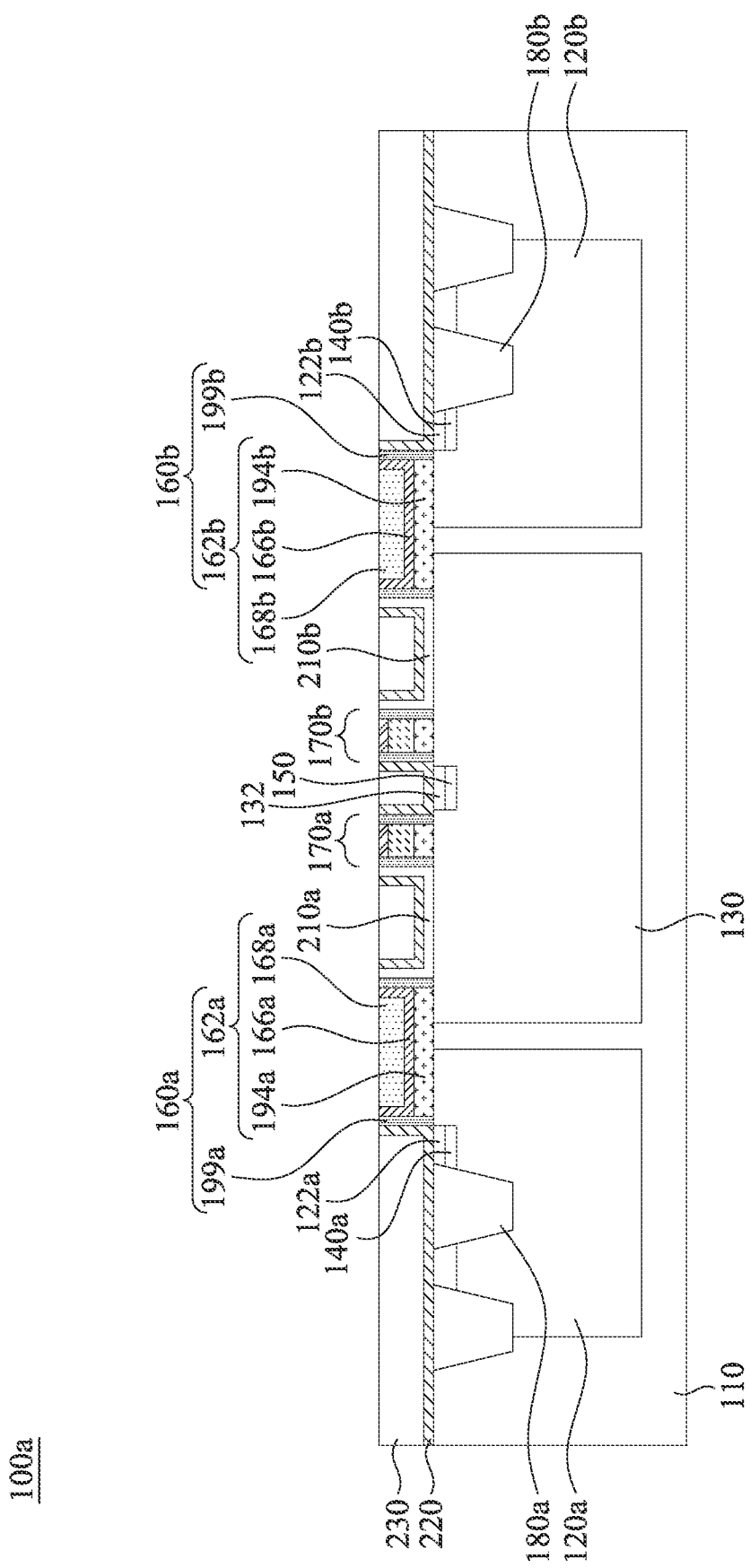
FIG. 13 is a cross-sectional view illustrating a semiconductor device in accordance with another embodiment of the present disclosure.

FIG. 13 is a cross-sectional view illustrating a semiconductor device 100a in accordance with another embodiment of the present disclosure, in which the semiconductor device 100a is fabricated by the alternative embodiment mentioned above in FIG. 10. In this embodiment, the gate dielectric layers 194a and 194b includes a high-k dielectric material and would not have been removed when the gate electrode layers 196a and 196b and the hard masks 198a and 198b were removed to form a shallower trench, thus the high-k gate dielectric layers 164a and 164b (see FIG. 12) need not be formed in the alternative embodiment. After the removal of the gate electrode layers 196a and 196b and the hard masks 198a and 198b, the first conductive layers 166a and 166b and the second conductive layers 168a and 168b are formed in the trench, and thereafter the materials outside the trench are removed in a CMP process. As such, the metal gate stack 162a is formed by the first conductive layer 166a, the second conductive layer 168a, and the gate dielectric layer 194a, and the metal gate stack 162b is formed by the first conductive layer 166b, the second conductive layer 168b, and the gate dielectric layer 194b. That is, the metal gate stacks 162a and 162b includes the gate dielectric layers 194a and 194b, the first conductive layers 166a and 166b, and the second conductive layers 168a and 168b in this embodiment.

Based on the aforementioned descriptions, since the semiconductor device includes the metal gates and the poly gates with different materials, gate height loss in a centre of an array aligned by the semiconductor devices caused by dishing or erosion effect during the CMP process can be reduced, thus improving the uniformity of the array and achieving a larger process window for the subsequent fabricating processes. Accordingly, there's no need for enlarging the size of the array to reduce the distribution density of the metal gates for the concern of the gate height loss. Therefore, numbers of the semiconductor device in the array can be reduced, thus lowering the associated costs.

In some embodiments, a semiconductor device includes a substrate, a first well, a second well, a metal gate, a poly gate, a source region, and a drain region. The first well and the second well are within the substrate. The metal gate is partially over the first well. The poly gate is over the second well. The poly gate is separated from the metal gate, and a width ratio of the poly gate to the metal gate is in a range from about 0.1 to about 0.2. The source region and the drain region are respectively within the first well and the second well.

In some embodiments, a semiconductor device includes a substrate, two first wells, a second well, a first metal gate, a second metal gate, a first poly gate, a second poly gate, a source region, and a drain region. The first wells and the second well are within the substrate, in which the second well is between the first wells. The first metal gate is partially over one of the two first wells. The second metal gate is partially over the other of the two first wells. The first poly gate and the second poly gate are over the second well, in which the first poly gate is separated from the second poly gate. The source region and the drain region are respectively within the first well and the second well.

In some embodiments, a method of fabricating a semiconductor device includes: forming a first well and a second well in a substrate, in which the first well and the second well are doped with different types of dopants; forming a dummy gate partially over the first well and partially over the second well, in which the dummy gate includes a dummy gate stack; forming a poly gate over the second well, in which the poly gate includes a poly gate stack, and a gap is between the dummy gate and the poly gate; forming a source region and a drain region respectively in the first well and the second well, in which the source region and the drain region are doped with a same type of dopants; and replacing the dummy gate stack with a metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming shallow trench isolation (STI) structures in a substrate;
   forming a dummy gate stack and a poly gate stack over the substrate, wherein the dummy gate stack has a lateral dimension wider than a lateral dimension of the poly gate stack;
   forming a source region between the dummy gate stack and a first one of the STI structures;
   forming a drain region between the poly gate stack and a second one of the STI structures;
   after forming the drain region between the poly gate stack and the second one of the STI structures, conformally depositing an oxide material layer over the substrate, the dummy gate stack and the poly gate stack;
   patterning the oxide material layer; and
   replacing the dummy gate stack with a metal gate stack, wherein the metal gate stack has a lateral dimension wider than the lateral dimension of the poly gate stack.

2. The method of claim 1, wherein a distance between the metal gate stack and the poly gate stack is in a range from about 0.1 µm to about 1 µm.

3. The method of claim 1, wherein patterning the oxide material layer is performed such that the oxide material layer remains between the dummy gate stack and the poly gate stack.

4. The method of claim 1, wherein patterning the oxide material layer is performed such that the oxide material layer extends over a top surface of the dummy gate stack and along a sidewall of the dummy gate stack.

5. The method of claim 1, wherein patterning the oxide material layer is performed such that the oxide material layer extends over a top surface of the poly gate stack and along a sidewall of the poly gate stack.

6. The method of claim 1, further comprising:
   after patterning the oxide material layer, performing a silicidation process to a surface of the substrate exposed by the oxide material layer.

7. The method of claim 1, further comprising:
   after patterning the oxide material layer, performing a silicidation process to form a first silicide region on the drain region and a second silicide region on the source region.

8. The method of claim 7, wherein the silicidation process is performed prior to replacing the dummy gate stack with the metal gate stack.

9. The method of claim 1, wherein the dummy gate stack, the poly gate stack and the STI structures are arranged along a direction, the dummy gate stack has a lateral dimension along the direction wider than a lateral dimension of the poly gate stack along the direction.

10. A method of fabricating a semiconductor device, comprising:
    forming a first well and a second well in a substrate, wherein the first well and the second well include different types of dopants, and the first well is a neighbor to the second well;
    forming a dummy gate stack and a poly gate stack on the substrate, wherein the dummy gate stack and the poly gate stack are physically separated from each other;
    forming a source region adjacent to the dummy gate stack, wherein the source region is in the first well;
    forming a drain region adjacent to the poly gate stack, wherein the drain region is in the second well; and
    replacing the dummy gate stack with a metal gate stack, wherein the metal gate stack overlaps the first well and the second well, and the poly gate stack overlaps the second well and does not overlap the first well.

11. The method of claim 10, wherein the poly gate stack is between the metal gate stack and the drain region.

12. The method of claim 10, wherein the poly gate stack is between the first well and the drain region.

13. The method of claim 10, wherein the metal gate stack is between the source region and the poly gate stack.

14. The method of claim 10, further comprising:
    after forming the drain region, forming an oxide layer between the dummy gate stack and the poly gate stack;
    forming an etch stop layer lining the oxide layer; and
    forming an interlayer dielectric layer covering the etch stop layer.

15. The method of claim 14, wherein forming the oxide layer comprises:
    forming the oxide layer exposing the source region and the drain region.

16. The method of claim 14, wherein the oxide layer is in contact with the second well.

17. A method of fabricating a semiconductor device, comprising:
    forming a first well and a second well in a substrate, wherein the first well and the second well include different types of dopants, and the first well is a neighbor to the second well;
    forming a dummy gate stack and a poly gate stack on the substrate, wherein the dummy gate stack is on the first well and the second well, and the poly gate stack is on the second well and is discontinuous from the dummy gate stack;
    forming a source region adjacent to the dummy gate stack, wherein the source region is in the first well;
    forming a drain region adjacent to the poly gate stack, wherein the drain region is in the second well;
    depositing a hard mask on the poly gate stack, wherein the hard mask is made of polymer or metal; and
    after depositing the hard mask on the poly gate stack, replacing the dummy gate stack with a metal gate stack.

18. The method of claim 17, further comprising:
    removing the hard mask after replacing the dummy gate stack with the metal gate stack.

19. The method of claim 17, wherein replacing the dummy gate stack comprises:
    performing a planarization process to remove the dummy gate stack and the hard mask.

20. The method of claim 17, wherein depositing the hard mask on the poly gate stack comprises:
    forming the hard mask with a width larger than two times a width of the poly gate stack.

* * * * *